(12) United States Patent
Liao et al.

(10) Patent No.: US 12,492,869 B2
(45) Date of Patent: Dec. 9, 2025

(54) IMMERSION LIQUID COOLING HEAT SINK

(71) Applicant: JWS TECHNOLOGY CO., LTD., New Taipei (TV)

(72) Inventors: Pang-Hung Liao, New Taipei (TW); Chih-Wei Chen, New Taipei (TW); Shih-Ming Wang, New Taipei (TW)

(73) Assignee: JWS TECHNOLOGY CO., LTD., New Taipei (TW)

( * ) Notice: Subject to any disclaimer, the term of this patent is extended or adjusted under 35 U.S.C. 154(b) by 115 days.

(21) Appl. No.: 18/428,135

(22) Filed: Jan. 31, 2024

(65) Prior Publication Data
US 2025/0244085 A1 Jul. 31, 2025

(51) Int. Cl.
*F28F 1/26* (2006.01)
*F28F 1/04* (2006.01)

(52) U.S. Cl.
CPC . *F28F 1/26* (2013.01); *F28F 1/04* (2013.01)

(58) Field of Classification Search
CPC ...................................... F28F 1/26; F28F 1/04
USPC ....................................................... 165/181
See application file for complete search history.

(56) References Cited

U.S. PATENT DOCUMENTS

| 10,827,647 | B2 | 11/2020 | Lin et al. | |
| 11,832,396 | B2* | 11/2023 | Iyengar | G06F 1/20 |
| 2012/0175094 | A1* | 7/2012 | Rice | F28F 3/12 |
| | | | | 165/170 |
| 2014/0252585 | A1* | 9/2014 | Chen | H01L 23/44 |
| | | | | 257/692 |
| 2017/0045307 | A1* | 2/2017 | Tsai | H01L 23/473 |
| 2018/0238642 | A1* | 8/2018 | Seki | H01L 23/473 |

FOREIGN PATENT DOCUMENTS

TW 202310722 A 3/2023

OTHER PUBLICATIONS

Office Action dated Jul. 31, 2024 of the corresponding Taiwan patent application No. 112148140.

* cited by examiner

*Primary Examiner* — Hai H Huynh
(74) *Attorney, Agent, or Firm* — HDLS IPR SERVICES; Chun-Ming Shih

(57) ABSTRACT

An immersion liquid cooling heat sink includes a substrate, a fin assembly and a housing. The fin assembly is disposed on the substrate and includes a first fin module and a second fin module, both having multiple passages. Each passage has an inlet and an outlet, the first and second fin modules are spaced from each other to form a first groove which communicate between each inlet of the first fin module and each inlet of the second fin module. The housing is disposed on the substrate and has a first liquid inlet port, and covers the entire fin assembly and exposes each outlet. The first liquid inlet port is arranged corresponding to the first groove and communicates to the first groove, so as to enable a dielectric fluid to flow directly from the mid-section to two ends of the fin assembly.

15 Claims, 14 Drawing Sheets

IMMERSION LIQUID COOLING HEAT SINK

BACKGROUND OF THE DISCLOSURE

Technical Field

The present disclosure relates to a liquid cooling heat sink, and more particularly relates to an immersion liquid cooling heat sink.

Related Art

In an immersion liquid cooling system, a heat generating element of an electronic device (such as a server) is immersed in a dielectric liquid (which is a non-conductive liquid) inside the sealed chassis of the electronic device in order to carry away the heat generated by the heat generating element through the physical properties of the dielectric liquid. In general, the immersion liquid cooling system is mainly divided into single-phase and biphasic systems, the single-phase system uses a pump to drive the dielectric liquid to produce a circulation flow, and operates with a heat and cold exchanger to achieve the effect of heat dissipation. On the other hand, the biphasic system uses a low boiling point dielectric liquid in connection part with a condenser to continuously produce phase changes of the dielectric liquid, so as to achieve the heat dissipation effect.

Related-art immersion liquid cooling systems, regardless of the single-phase or biphasic systems, are usually equipped with a heat sink having a plurality of fins and mounted on the heat generating element, and the heat sink is immersed in the dielectric liquid, not only rapidly conducting the heat generated by the heat generating element to each fin, but also cooling down the temperature by the dielectric liquid.

Although the related-art heat sinks also input dielectric fluid into the flow channel between every two adjacent fins and use the dielectric fluid that flows in the flow channel to carry away the heat on the fins, however, the spacing of the flow channel between adjacent fins is limited, and the dielectric fluid has a certain degree of viscosity, which gives rise to a poor fluidity of the dielectric fluid in the flow channel and a reduced overall heat dissipation efficiency.

In order to improve the mobility of the dielectric liquid, the dielectric liquid is forced by external forces to pass through the passage, however, the liquid inlet port used by the heat sink to input the dielectric liquid into the passage is configured to be corresponsive the inlets of all passages. In other words, the dielectric liquid can only flow from the inlet of each passage to the outlet of each passage, so the heat exchange capacity of the dielectric liquid after the heat exchange is greatly reduced in the substantially middle of each passage, resulting in a significant difference in the heat dissipation efficiency between the front section of the heat sink and the rear section of the heat sink, and thus not able to carry out a complete heat dissipation of the heat generating element.

Therefore, how to improve the aforementioned technical issues is a main subject for the present discloser to overcome.

SUMMARY OF THE DISCLOSURE

The objective of the present disclosure is to provide an immersion liquid cooling heat sink that allows a dielectric liquid to be poured into a groove and flowed directly from a mid-section of a fin assembly to two ends of the fin assembly away from each other, so as to overcome the problem of having a significant difference in the heat dissipation efficiency between the front section and the rear section of the fin assembly.

To achieve the aforementioned objective, the present disclosure provides an immersion liquid cooling heat sink, including: a substrate; a fin assembly, installed on the substrate and including a first fin module and a second fin module, the first fin module and the second fin module having a plurality of passages, two ends of each passage having an inlet and an outlet, the first fin module and the second fin module being separated with a space from each other to form a first groove, the first groove communicating between each inlet of the first fin module and each inlet of the second fin module; and a housing, installed on the substrate and having a first liquid inlet port, the housing covering the entire fin assembly correspondingly and exposing each outlet of the first fin module and each outlet of the second fin module, and the first liquid inlet port arranged corresponding to the first groove and communicating to the first groove.

Compared with the related art, the present disclosure has the following effects. After the dielectric liquid is poured from the first liquid inlet port into the first groove, the dielectric liquid directly flows from the first groove at the mid-section of the fin assembly through each passage of the first fin module and each passage of the second fin module to ensure the heat exchange capacity of the dielectric liquid in the entire fin assembly, so as to avoid the problem that only the front section is cold and the rear section is hot, and perform complete heat dissipation of the heat generating element.

DETAILED DESCRIPTION

The technical characteristics of this disclosure will become apparent with the detailed description of preferred embodiments accompanied with the illustration of related drawings as follows. It is noteworthy that the embodiments and drawings disclosed herein are to be considered illustrative rather than restrictive.

Figure 1:
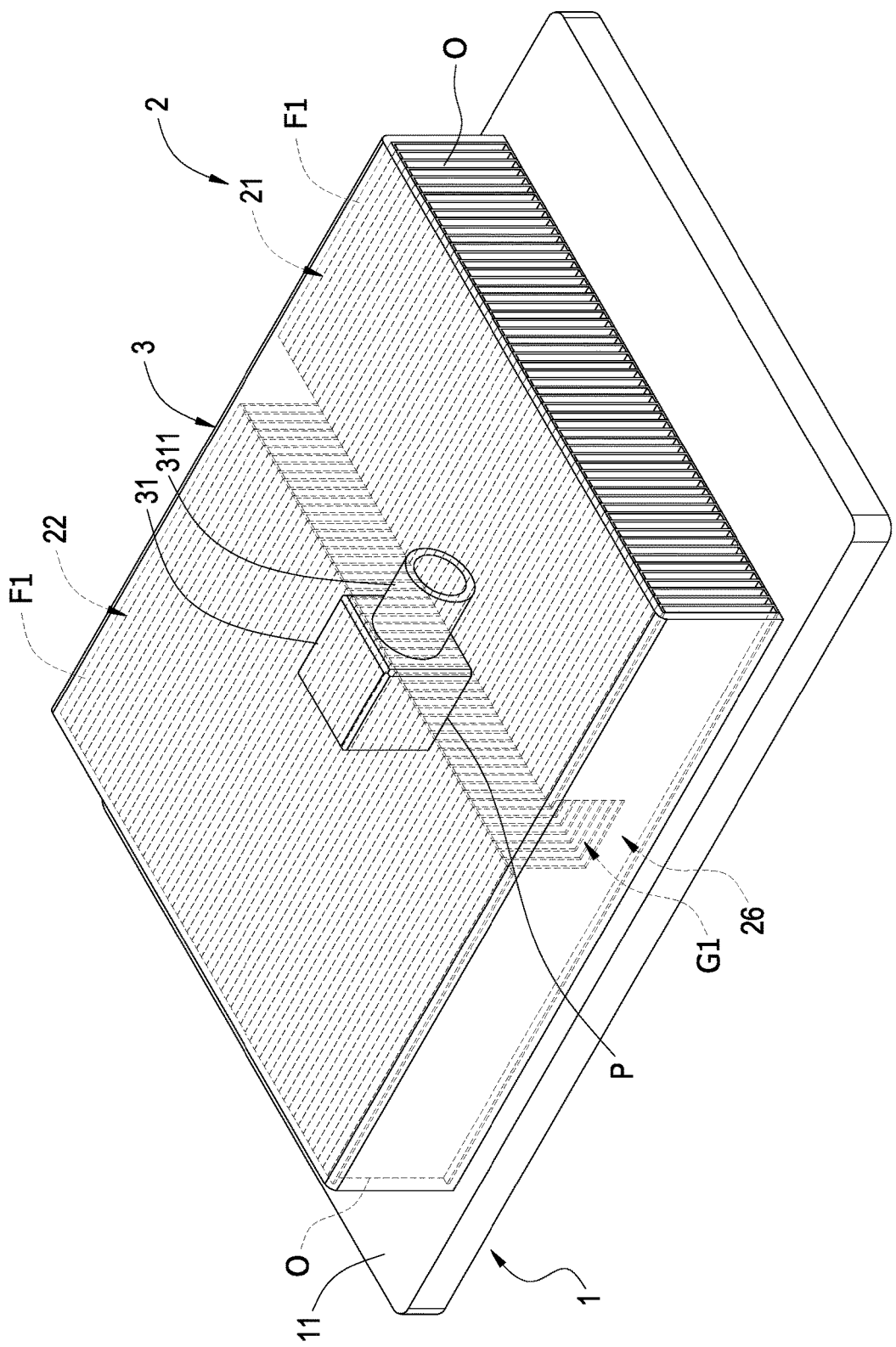
FIG. 1 is a perspective view of a first embodiment of the present disclosure.
Figure 2:
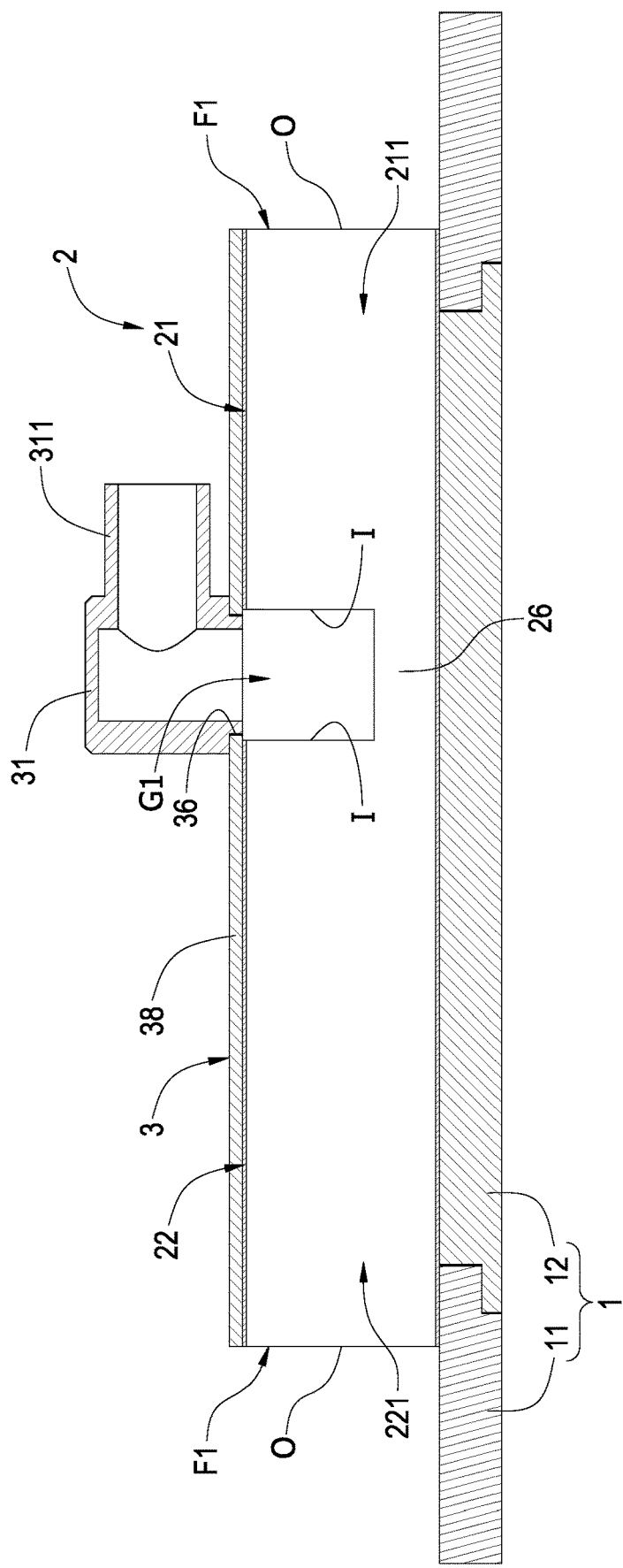
FIG. 2 is a cross-sectional view of the first embodiment of the present disclosure.
Figure 3:
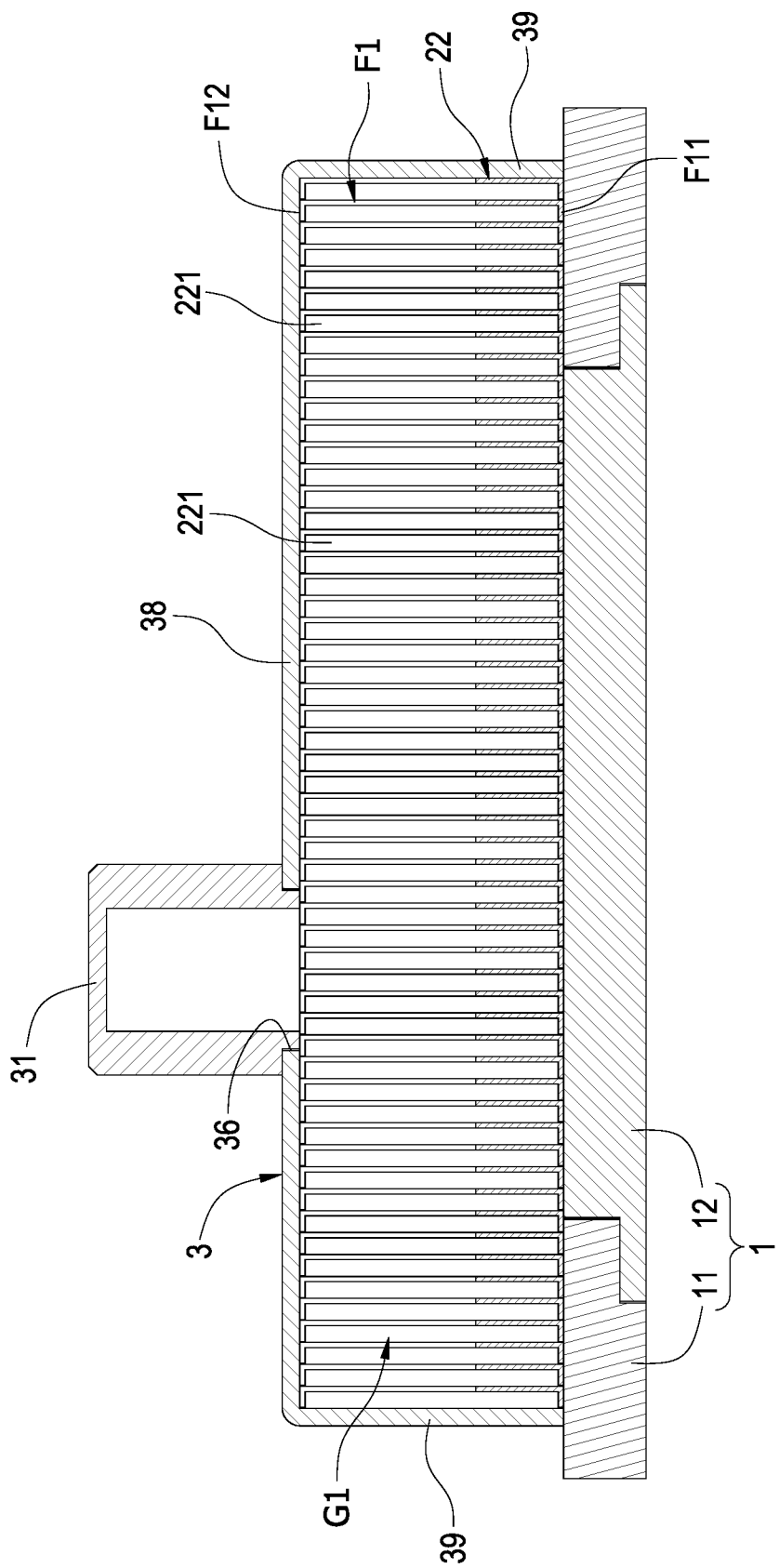
FIG. 3 is a longitudinal sectional view of the first embodiment of the present disclosure.
Figure 4:
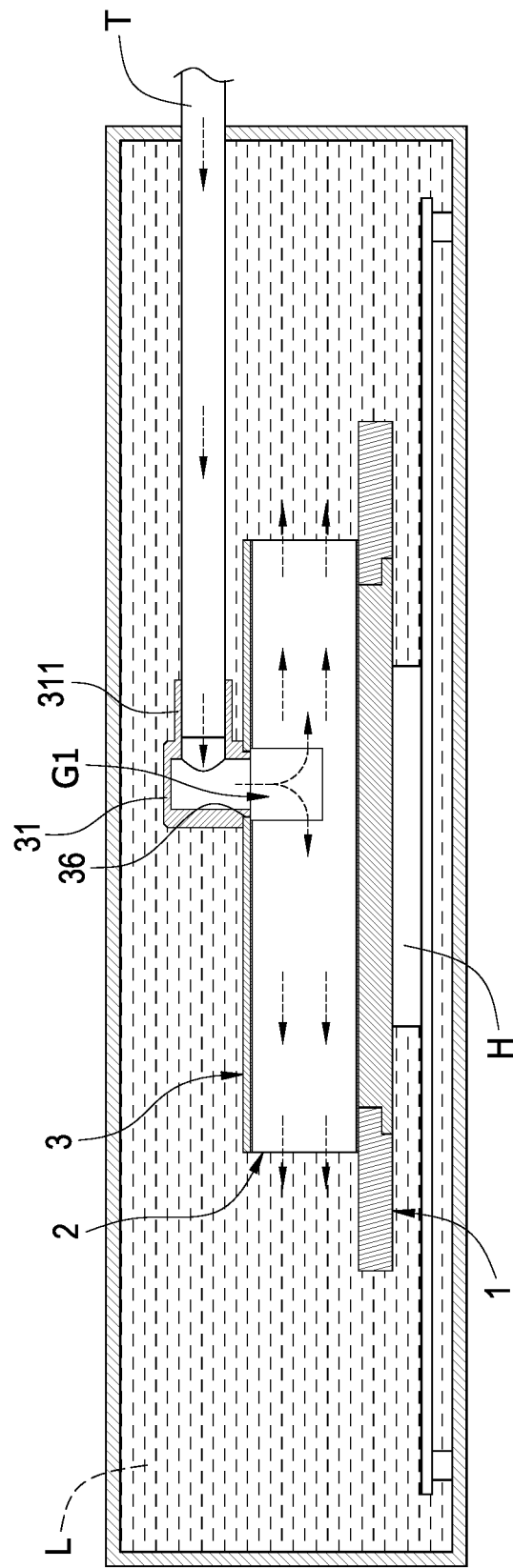
FIG. 4 is a cross-sectional view showing the first embodiment of the present disclosure; during use.
Figure 5:
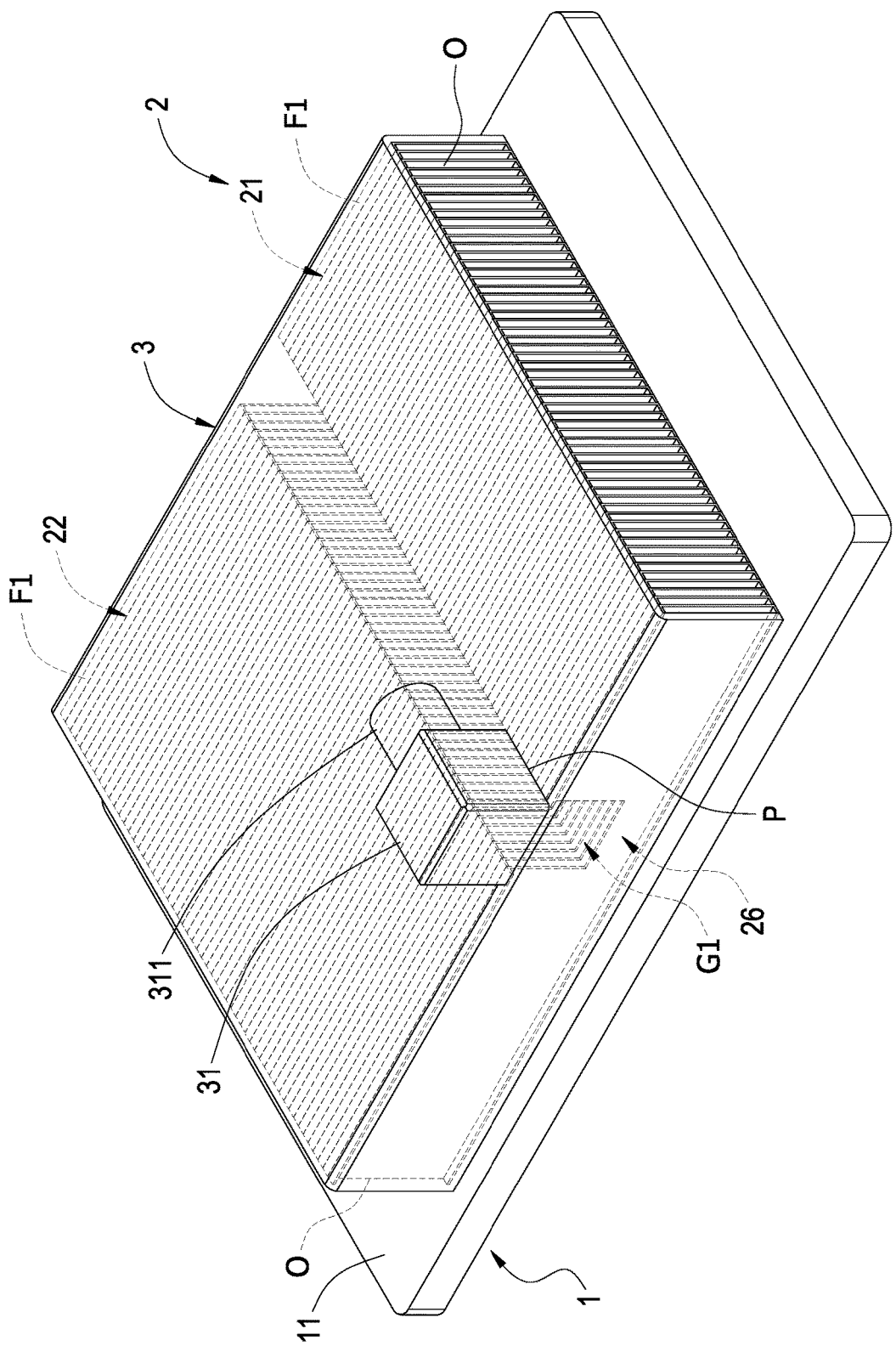
FIG. 5 is a perspective view of a second embodiment of the present disclosure.

With reference to FIG. 4 for an immersion liquid cooling heat sink in accordance with the present disclosure, the immersion liquid cooling heat sink is used in an immersion liquid cooling system and attached onto a heat generating element H. The heat generating element H is immersed in a dielectric liquid L, and the heat generated by the heat generating element H is thermally exchanged to the dielectric liquid L, so as to achieve the heat dissipation effect. With reference to FIGS. 1 to 4 for the first embodiment, FIG. 5 for the second embodiment, FIGS. 6 and 7 for the third embodiment, FIGS. 8 and 9 for the fourth embodiment, FIGS. 10 and 11 for the fifth embodiment, FIGS. 12 and 13 for the sixth embodiment, and FIG. 14 for the seventh embodiment of the present disclosure.

In FIGS. 1 to 4, the immersion liquid cooling heat sink in accordance with the first embodiment of the present disclosure includes: a substrate 1, a fin assembly 2 and a housing 3.

The substrate 1 is a one-piece structure or a two-piece structure, and the first embodiment is not limited to the above structures only. In other embodiments, the substrate 1 is a two-piece structure including a frame 11 and a main body 12, the main body 12 is installed in the frame 11 and has a desirable thermal conductivity, a side of the main body 12 is attached onto a heat generating element H for quickly absorbing the heat generated by the heat generating element H.

The fin assembly 2 is installed on a side of the substrate 1, and it may be a one-piece structure, a two-piece structure or a multiple-piece structure, and the present disclosure is not limited to the above structures only. In the first embodiment, the fin assembly 2 is the one-piece structure including a first fin module 21, a second fin module 22 and a connection part 26 connected between the first fin module 21 and the second fin module 22.

The first fin module 21 and the second fin module 22 have a plurality of passages 211, 221 arranged parallelly to one another, and two ends of each passage 211, 221 have an inlet I and an outlet O respectively. The first fin module 21 and the second fin module 22 are spaced apart from each other and arranged side by side to form a first groove G1, and the first groove G1 communicates to each inlet I of the first fin module 21 and each inlet I of the second fin module 22.

The connection part 26 is connected corresponding to the first groove G1 and communicates between the bottom of each inlet I of the first fin module 21 and the bottom of each inlet I of the second fin module 22. In a specific embodiment, the first groove G1 is formed as a partially disconnected groove (disconnected at the top but connected at the bottom) on the fin assembly 2, such that the fin assembly 2 is separated by the first groove G1 into a first fin module 21 and a second fin module 22, and the connection part 26 is the portion of the fin assembly 2 which is not disconnected by the first groove G1.

The housing 3 is installed on the same side of the substrate and has a first liquid inlet port 36. The first liquid inlet port 36 may be an opening formed on the housing 3 or a hollow tube connected and communicating to the housing 3. The first liquid inlet port 36 of this embodiment is an opening. The housing 3 covers the entire fin assembly 2 (and it is a totally covered housing 3) and exposing each outlet O of the first fin module 21 and each outlet O of the second fin module 22, and the first liquid inlet port 36 is arranged corresponding to the first groove G1 and communicates to the first groove G1. A tube T (as shown in FIG. 4) is connected between the first liquid inlet port 36 and a pump (not shown in the figures).

To facilitate the connection of the tube T, the open first liquid inlet port 36 of the housing 3 is connected and communicates to a first connector 31, the first connector 31 further has a docking port 311 communicating to the first liquid inlet port 36. The tube T is further connected to the docking port 311.

In an embodiment, the housing 3 includes a cover plate 38 and two side panels 39, the two side panels 39 are symmetrically connected to two sides of the cover plate 38 opposites to each other and bent in the same direction relative to the cover plate 38 (such as being bent into a substantially inverted U-shape), the cover plate 38 covers the top surface of the fin assembly 2, and the two side panels 39 cover two sides of the fin assembly 2. The cover plate 38 has a biased portion P, and the first liquid inlet port 36 is disposed at the biased portion P.

It is noteworthy that the present disclosure does not limit the position of the first liquid inlet port 36 at the first groove G1, but if the positions are arranged corresponding to the heat generating element H, the heat dissipation effect may be better. For example, if the heat generating element H is arranged corresponding to the mid-section of the first groove G1 (wherein the first groove G1 has a first end, a second end, and a mid-section connected between the first end and the second end), then the first liquid inlet port 36 is arranged corresponding to the mid-section of the first groove G1 as shown in FIGS. 1, 6, 8, 10 and 12. If the heat generating element H is arranged corresponding to the first end of the first groove G1 as shown in the second embodiment of the present disclosure, the first liquid inlet port 36 is also arranged corresponding to the first end of the first groove G1. In other words, the position of the biased portion P on the cover plate 38 may be arranged according to the position of the heat generating element H for optimization adjustment.

In this way, as shown in FIG. 4, the first groove G1 is disposed between the first fin module 21 and the second fin module 22 and communicates to the first liquid inlet port 36, that is, the first liquid inlet port 36 is disposed at the mid-section of the entire fin assembly 2, so that the dielectric liquid L passes through the tube T, flows out from the first liquid inlet port 36, enters into the first groove G1, and then flows from the first groove G1 into each inlet I of the first fin module 21 and each inlet I of the second fin module 22 separately, and finally is outputted from each outlet O of the first fin module 21 and each outlet O of the second fin module 22. In other words, the dielectric liquid L may flow from the mid-section of the fin assembly 2 through each passage 211 of the first fin module 21 and each passage 221 of the second fin module 22 to force the dielectric liquid L to flow from the mid-section of the fin assembly 2 toward the two ends of the fin assembly 2 away from each other to ensure that the heat exchange capacity of the dielectric liquid L in the entire fin assembly 2 and avoid the problem that only the front section is cold and the rear section is hot, so as to perform a complete heat dissipation of the heat generating element H. In addition, the first groove G1 is disposed under the first liquid inlet port 36, which also provides the effect of dispersing the pressure of the incoming liquid.

It is noteworthy that both the first fin module 21 and the second fin module 22 include a plurality of fins F1 spaced apart from each other and arranged side by side, and the fin F1 has a first fin side F11 and a second fin side F12 opposite to each other, the first fin side F11 of each fin F1 is jointly formed on a side which is mounted (such as soldered) onto the substrate 1, and the second fin side F12 of each fin F1 is jointly covered by the cover plate 38. In addition, the spacing between every two adjacent fins F1 forms the passage 211, 221.

Figure 6:
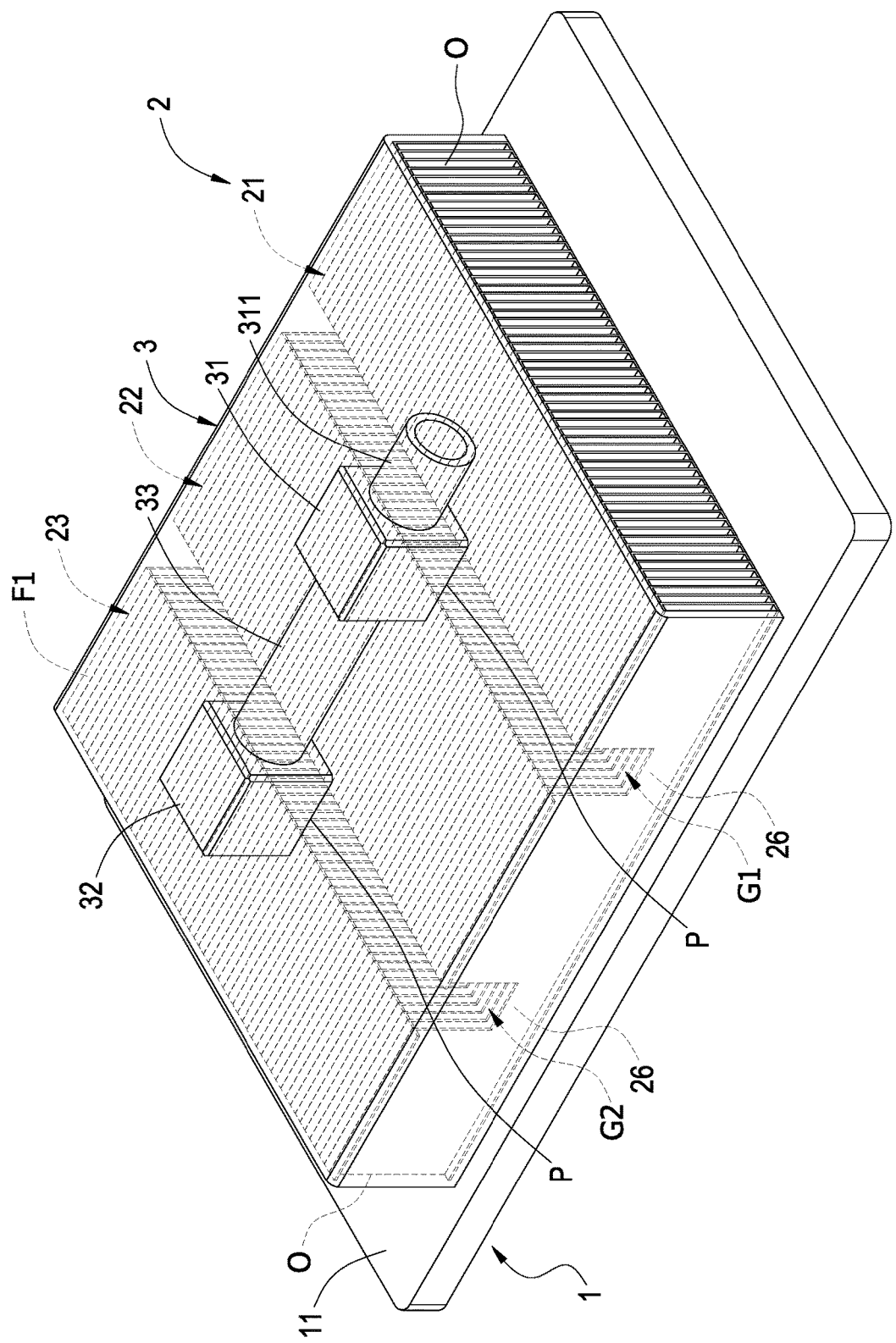
FIG. 6 is a perspective view of a third embodiment of the present disclosure.
Figure 7:
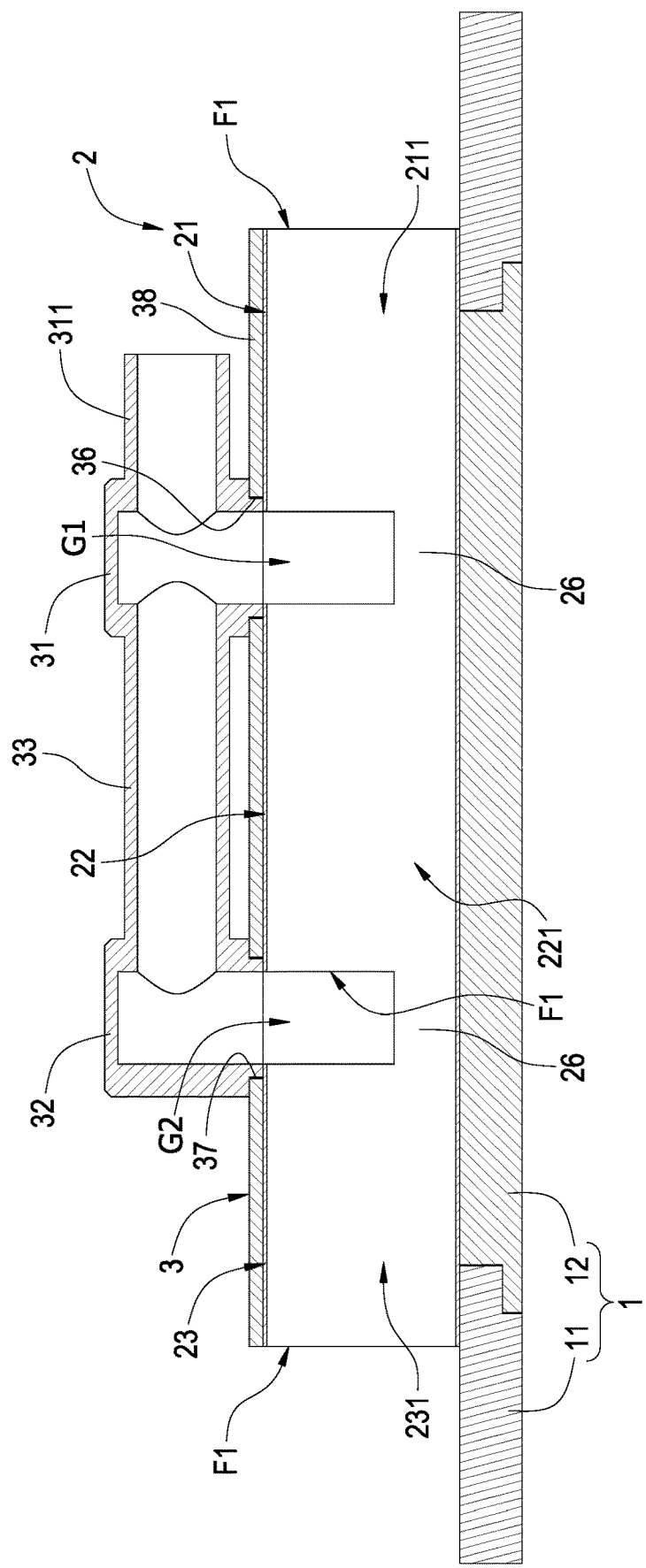
FIG. 7 is a cross-sectional view of the third embodiment of the present disclosure.

With reference to FIGS. 6 and 7 for the third embodiment of the present disclosure. The third embodiment is substantially the same as the first embodiment, except that the fin assembly 2 and housing 3 of the third embodiment have some changes.

In this embodiment, the fin assembly 2 includes a third fin module 23 and another connection part 26 connected between the third fin module 23 and the second fin module 22. The third fin module 23 also has a plurality of passages 231 (two ends of each passage 231 also have an inlet and an outlet, which are not labeled in the figures). The third fin module 23 and the second fin module 22 are spaced apart from each other and arranged side by side to form a second groove G2. The first groove G1 communicates to each passage 211 of the first fin module 21 and each passage 221 of the second fin module 22, the second groove G2 communicates to each passage 231 of the third fin module 23 and each passage 221 of the second fin module 22. The other connection part 26 is also disposed corresponding to the second groove G2 and communicates to the bottom of an end of each passage 231 of the third fin module 23 and the bottom of an end of each passage 221 of the second fin module 22 (the connection part 26 is connected to the corresponding position of the first groove G1 and communicates between the bottom of an end of each passage 211 of the first fin module 21 and the bottom of another end of each passage 221 of the second fin module 22). In a specific embodiment, the second groove G2 is defined as the partially disconnected groove (disconnected at the top but connected at the bottom) of the fin assembly 2. It is noteworthy that the third fin module 23 also includes a plurality of fins F1 spaced apart from each other and arranged side by side, the fin F1 also has a first fin side F11 (as shown in FIG. 3) and a second fin side F12 (as shown in FIG. 3) spaced apart from and opposite to each other, the first fin side F11 of each fin F1 is jointly formed into a side mounted or soldered onto the substrate 1, the second fin side F12 of each fin F1 is jointly covered by the cover plate 38, and the passage 231 is formed at the spacing between every two adjacent fins F1.

The housing 3 further comprises a second liquid inlet port 37 arranged corresponding to the second groove G2 and communicating to the second groove G2. Of course, the housing 3 may be further connected to and communicate to a second connector 32 at the opening-type second liquid inlet port 37, and a connecting pipe 33 is connected and communicates between the second connector 32 and the first connector 31, such that the dielectric liquid L from the docking port 311 may be poured into the second groove G2 through the connecting pipe 33. Therefore, the third embodiment not only fits the application for the situation of having two heat generating elements H (where, the first liquid inlet port 36 and the second liquid inlet port 37 are corresponding to the two heat generating elements H respectively, which has not been disclosed in FIGS. 6 and 7), but also has all the effects of the first embodiment.

Figure 8:
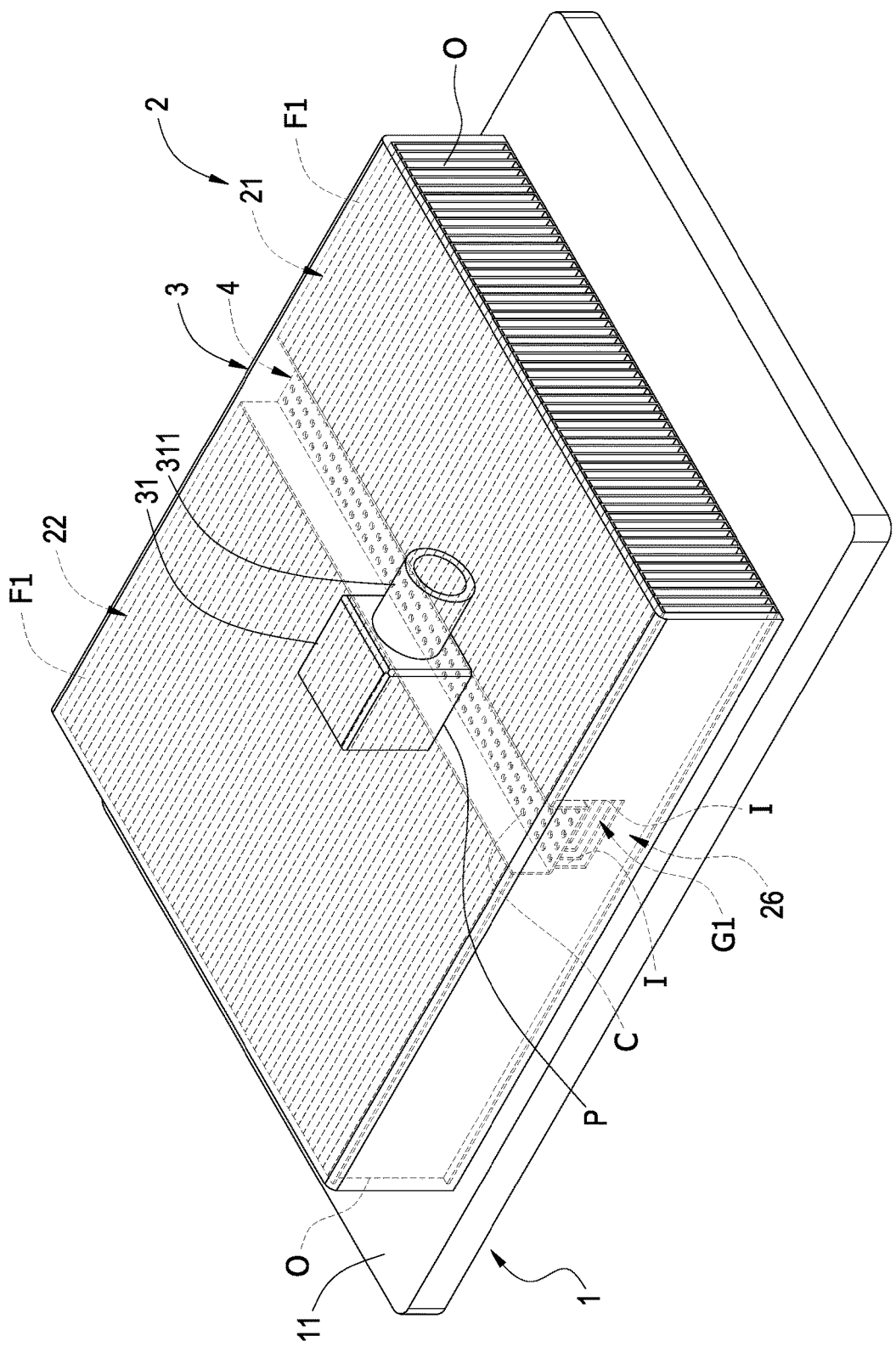
FIG. 8 is a perspective view of a fourth embodiment of the present disclosure.
Figure 9:
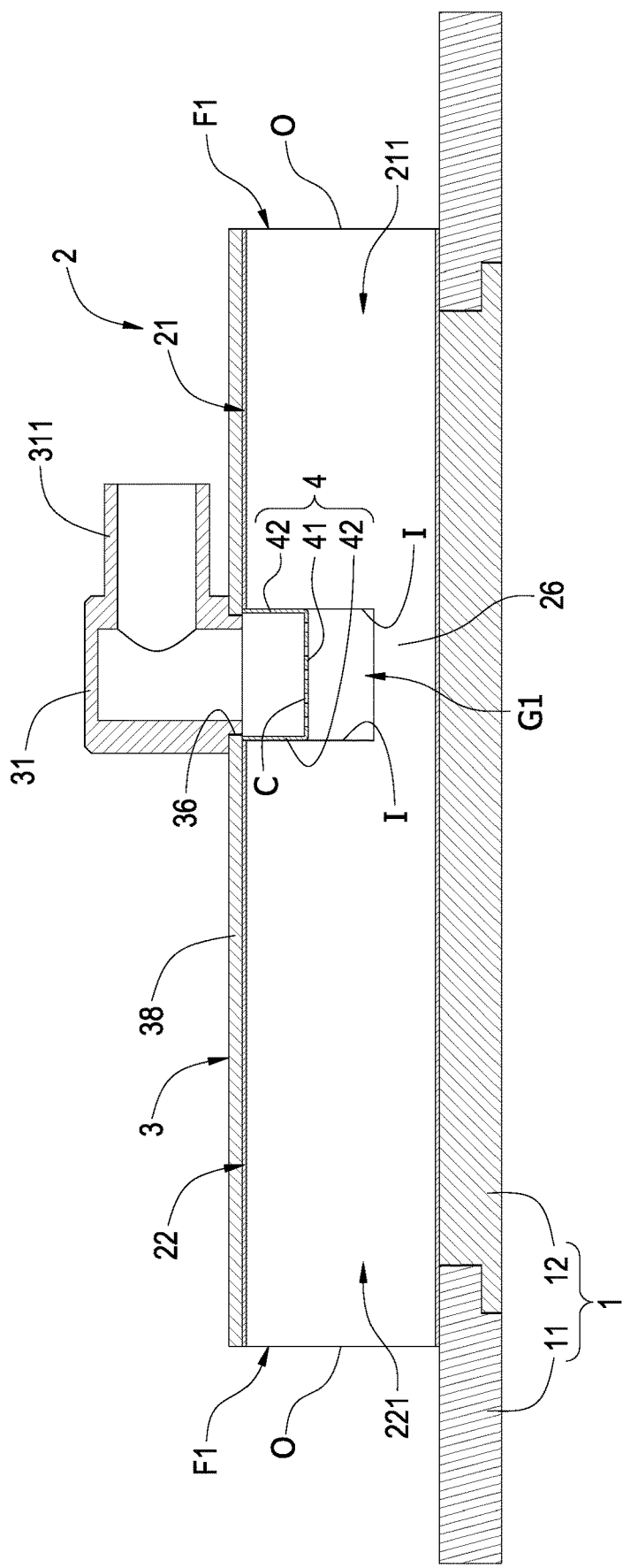
FIG. 9 is a cross-sectional view of the fourth embodiment of the present disclosure.

With reference to FIGS. 8 and 9 for the fourth embodiment of the present disclosure, the fourth embodiment is substantially the same as the first embodiment, except that the fourth embodiment further includes a shunt member 4.

The shunt member 4 has a plurality of flow channels C installed in the corresponding first groove G1. The first liquid inlet port 36 communicates to each inlet I of the first fin module 21 and each inlet I of the second fin module 22 through the plurality of flow channels C.

In a specific implementation of the fourth embodiment, the shunt member 4 includes a plate 41 and two bent plates 42, the plate 41 has two sides (not labeled in the figures) opposite to each other, and the two bent plates 42 are connected to the two opposite sides and bent toward the same direction relative to the two opposite sides respectively, so that the cross-section of the shunt member 4 is substantially U-shaped. The two bent plates 42 are installed to the top (or another part) of each inlet I of the first fin module 21 and the top (or another part) of each inlet I of the second fin module 22, so that the plate 41 is bridged (disposed) between each inlet I of the first fin module 21 and each inlet I of the second fin module 22 and suspended in the first groove G1 (where, the plate 41 is disposed between the first liquid inlet port 36 and the connection part 26 as shown in FIG. 9). The plate 41 is formed with the plurality of flow channels C, and each flow channel C is a through hole penetrating the plate 41, such that the plurality of flow channels C communicate between the first liquid inlet port 36 and the first groove G1.

In this way, when the dielectric liquid L is poured into the first groove G1 from the first liquid inlet port 36, the dielectric liquid L is diverted into the first groove G1 from each flow channel C and flows through each inlet I of the first fin module 21 and each inlet I of the second fin module 22, and then flows into each passage 211 of the first fin module 21 and each passage 221 of the second fin module 22, and finally flows to the outside through the outlet O of each passage 211, 221, so as to achieve the effect of allowing the dielectric liquid L to flow uniformly through each passage 211, 221. Of course, the fourth embodiment not only allows the dielectric liquid L to flow uniformly through each passage 211, 221, but also has all effects of the first embodiment. It is noteworthy that in other embodiments not shown in the figures. Of the fin assembly 2 further includes a second groove G2 as shown in FIG. 6, another shunt member 4 may be added and arranged corresponding to the second groove G2.

Figure 10:
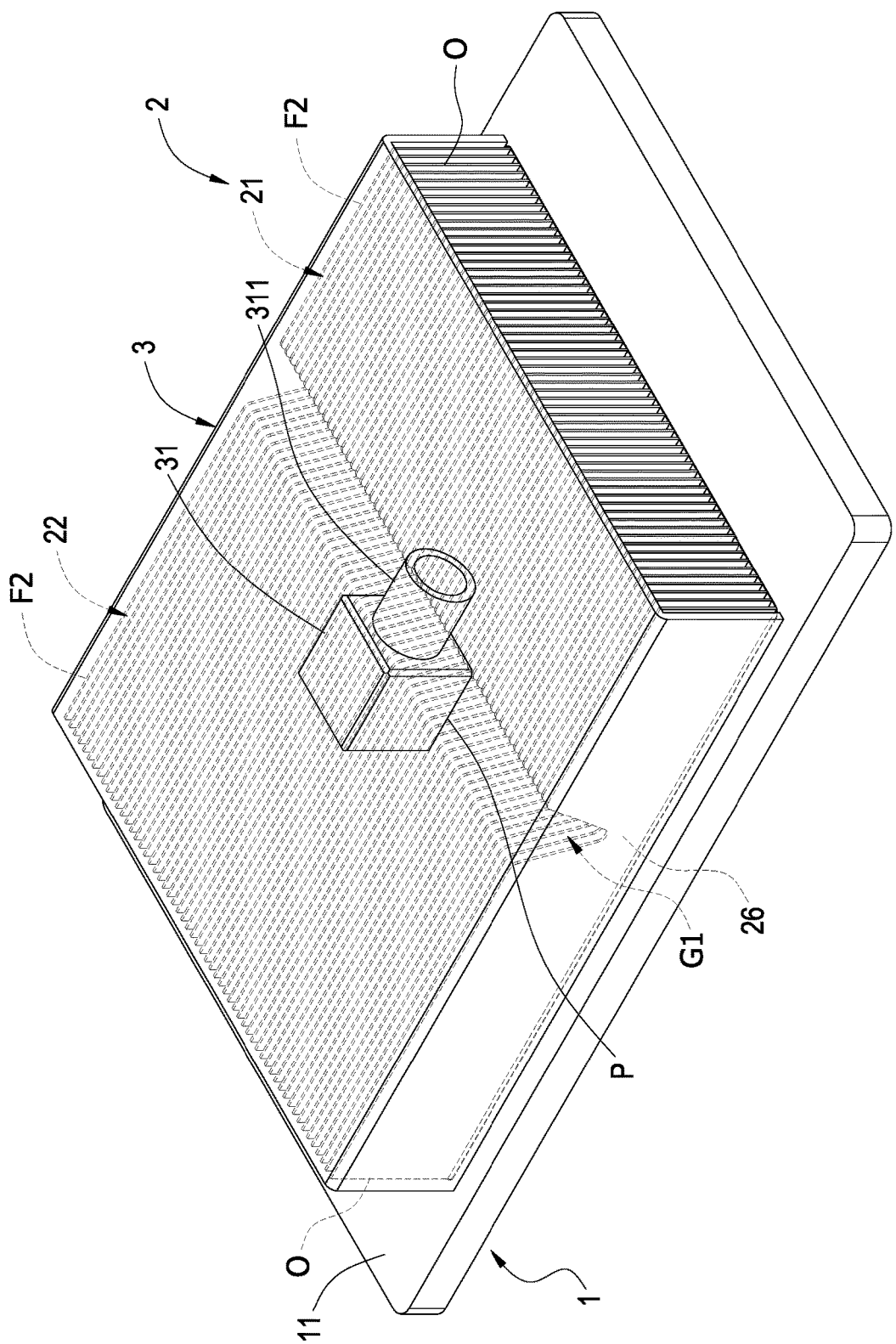
FIG. 10 is a perspective view of a fourth embodiment of the present disclosure.
Figure 11:
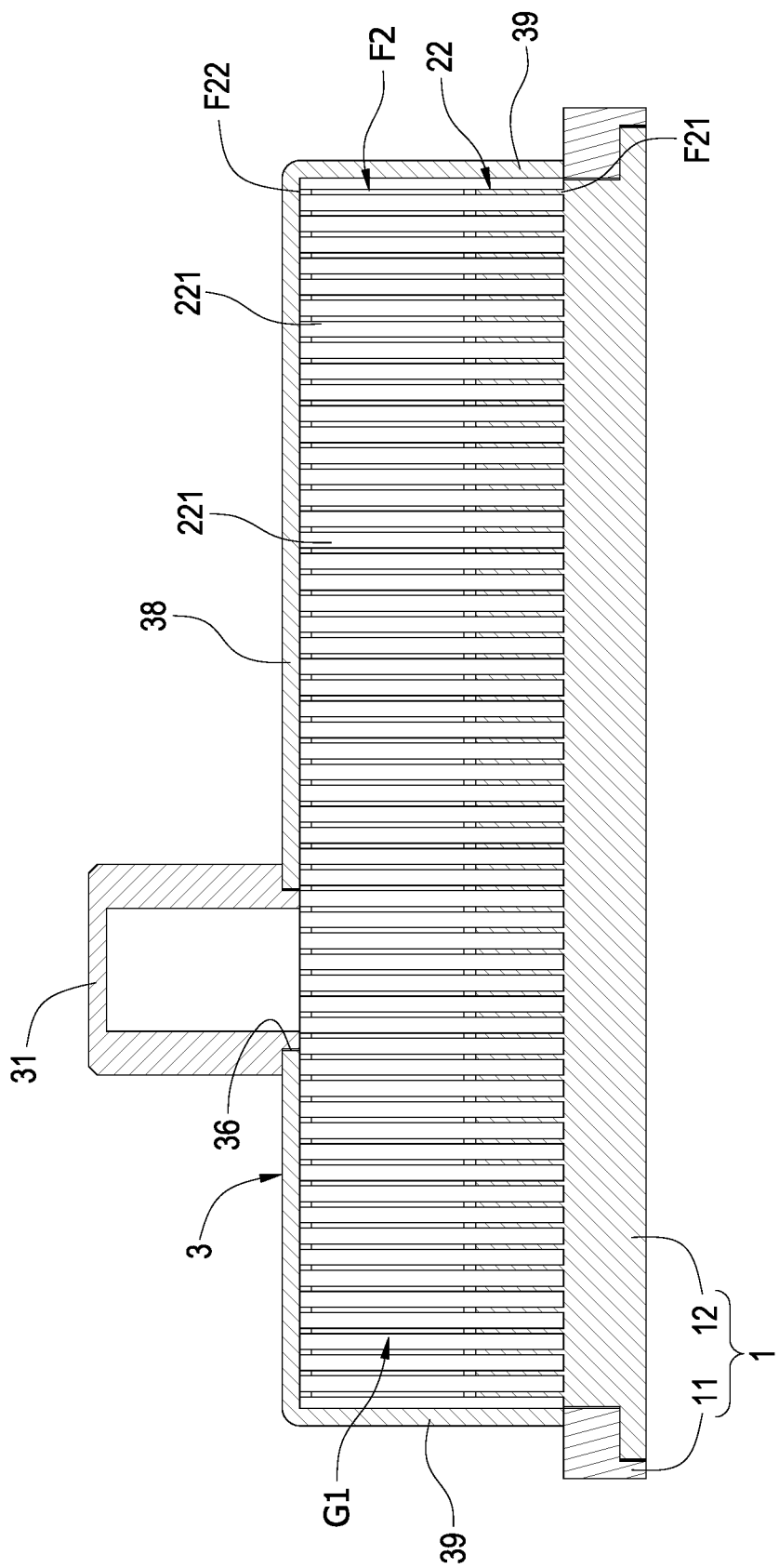
FIG. 11 is a longitudinal sectional view of the fourth embodiment of the present disclosure.

With reference to FIGS. 10 and 11 for the fifth embodiment of the present disclosure, the fifth embodiment is substantially the same as the first embodiment, except the shape of the first groove G1 of the fifth embodiment and the assembly of the fin assembly 2 are different from those of the first embodiment.

The schematic end view of the first groove G1 of the fifth embodiment shows a V-shaped partially disconnected groove (disconnected at the top but connected at the bottom), and thus the fin assembly 2 of the fifth embodiment also includes a connection part 26. On the other hand, the schematic end view of the first groove G1 of the first embodiment shows a U-shaped partially disconnected groove.

In the fifth embodiment, the fin assembly 2 is integrally formed with the substrate 1a. In a specific implementation mode of the fifth embodiment, the fin assembly 2 also includes a plurality of fins F2 spaced apart from each other and arranged side by side, and each fin F2 also has a first fin side F21 and a second fin side F22 as shown in FIG. 11. The first fin side F21 of each fin F2 is integrally formed on a side of the main body 12, so that no thermal resistance between the fin assembly 2 and the main body 12 may be generated due to soldering, and the main body 12 may be able to rapidly conduct heat to the fin assembly 2 and enhance the efficiency of heat conduction. The second fin side F22 of each fin F2 is also jointly covered by the cover plate 38. In addition, the passage 211, 221 is formed in the spacing between every two adjacent fins F2.

Figure 12:
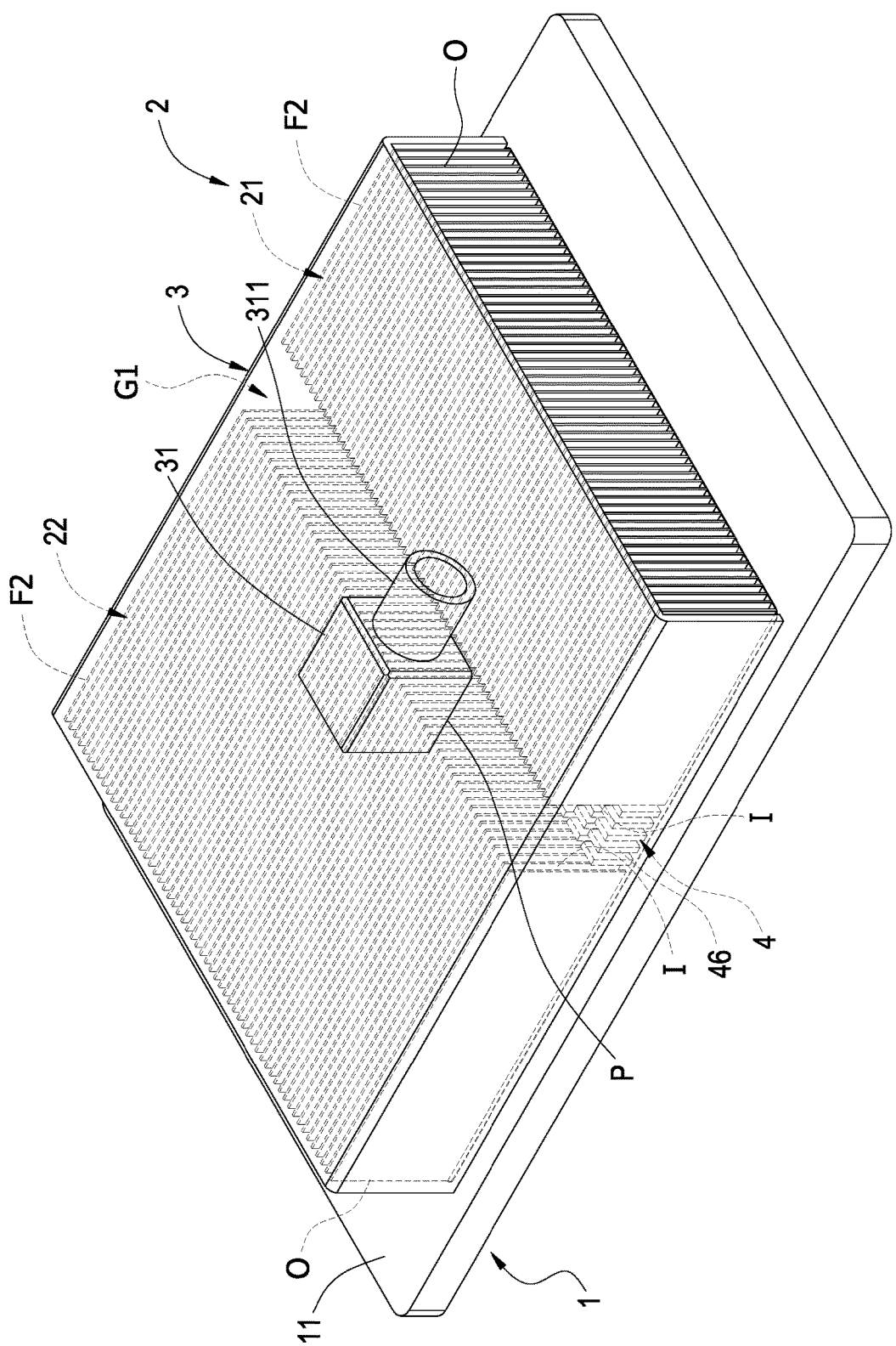
FIG. 12 is a perspective view of a sixth embodiment of the present disclosure.
Figure 13:
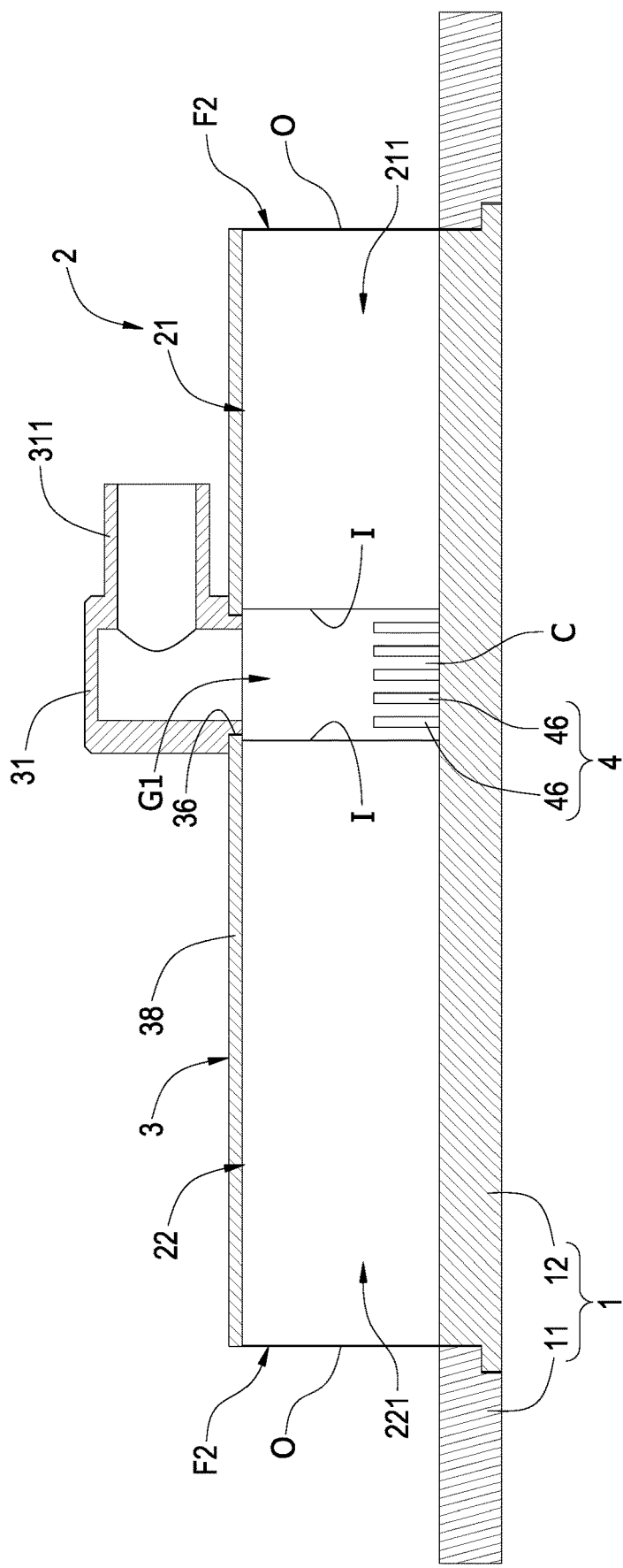
FIG. 13 is a cross-sectional view of the sixth embodiment of the present disclosure.

With reference to FIGS. 12 and 13 for the sixth embodiment of the present disclosure, the sixth embodiment is substantially the same as the fifth embodiment, except the fin assembly 2 of the sixth embodiment is changed to a two-piece structure and further includes a shunt member 4.

The fin assembly 2 of the sixth embodiment is disposed between the first fin module 21 and the second fin module 22, but no longer connected with the connection part 26, so that the first groove G1 formed between the first fin module 21 and the second fin module 22 may become a totally disconnected groove, which frees up space to install the shunt member 4. Of course, the sixth embodiment also has all effects of the fifth embodiment.

The shunt member 4 includes a plurality of flow channels C and is installed in the first groove G1. The first liquid inlet port 36 communicates to each inlet I of the first fin module 21 and each inlet I of the second fin module 22 through the plurality of flow channels C.

In a specific implementation mode of the sixth embodiment, the shunt member 4 includes a plurality of protruding blocks 46, all protruding blocks 46 are spaced apart from each other, and the protruding blocks 46 are integrally formed and disposed protrusively from a side of the main body 12. All protruding blocks 46 are disposed in the first groove G1, and each flow channel C is formed between every two protruding blocks 46. It is noteworthy that the plurality of flow channels C formed by the protruding blocks 46 also has the stable flow effect of stabilizing the flow of the dielectric liquid L in each passage 211 and each passage 221.

In summary, the sixth embodiment has the effect of flowing the dielectric liquid L through each passage 211, 221 by means of the shunt member 4, the effect of stabilizing the flow, and all effects of the embodiment. It is noteworthy that since each protruding block 46 is integrally formed and disposed protrusively from the main body 12, therefore the sixth embodiment further has the effect of increasing the heat dissipation area (because the presence of these protruding blocks 46 may increase the heat dissipation area in contact with the dielectric liquid L to improve the heat dissipation effect).

Figure 14:
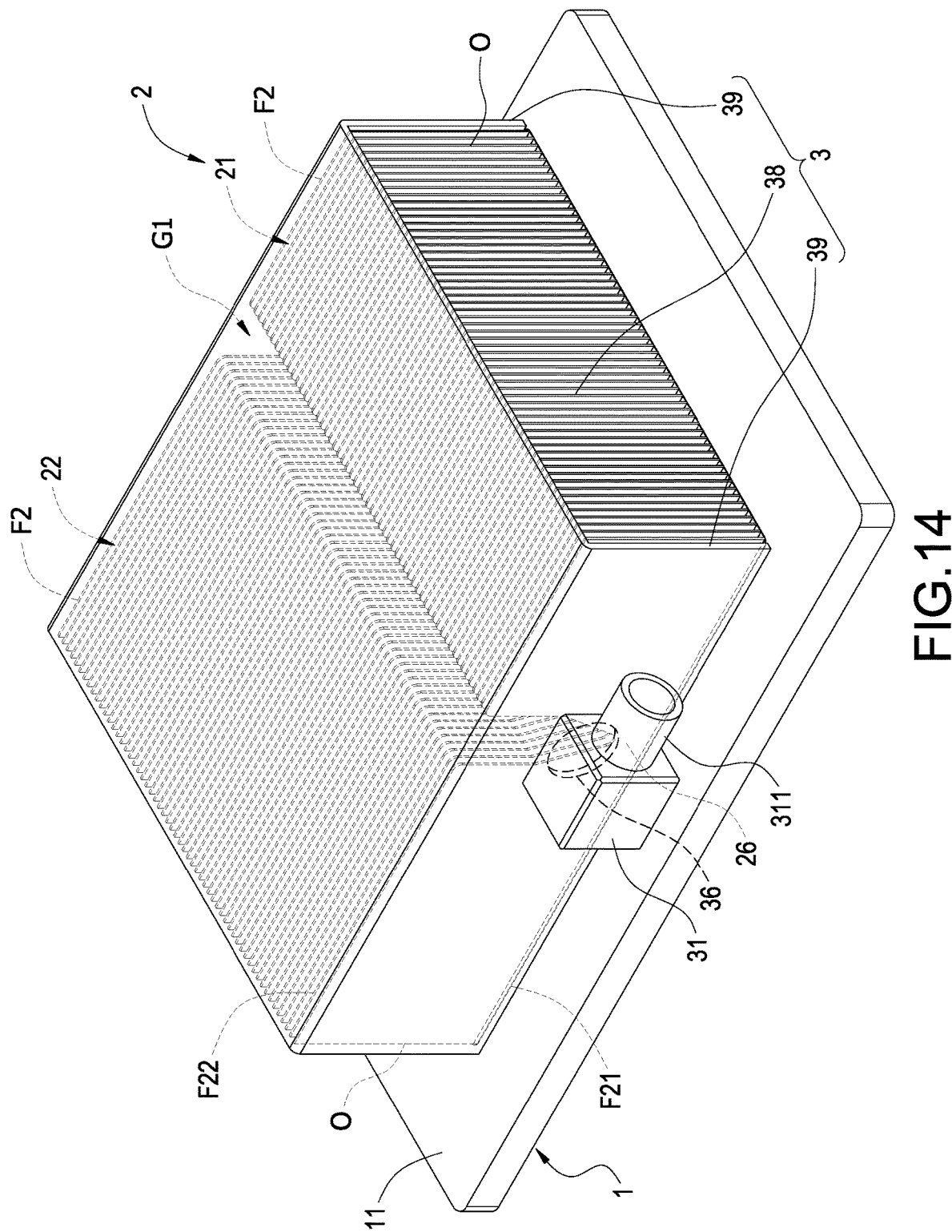
FIG. 14 is a perspective view of a seventh embodiment of the present disclosure.

With reference to FIG. 14 for the seventh embodiment of the present disclosure, the seventh embodiment is substantially the same as the first or fifth embodiment, except the position of forming the liquid inlet port of the seventh embodiment.

In the seventh embodiment, the first liquid inlet port 36 (or together with the second liquid inlet port 37) is arranged corresponding to the first groove G1 (or together with the second groove G2) and formed on one of the two side panels 39 of the housing 3, and of course, the first connector 31 (or together with the second connector 32) is also installed on this side panel 39 instead, so as to reduce the height of the immersion liquid cooling heat sink of the present disclosure, and fit the immersion liquid cooling heat sink that requires a lower height. In addition, in the case of the immersion liquid cooling heat sink where high heat dissipation efficiency is required, it is also possible to increase the permitted height of the fin F2 in a limited space in order to increase the heat dissipation area of the fin F2 and achieve the effect of improving the heat dissipation efficiency.

In summation of the description above, the immersion liquid cooling heat sink of the present disclosure achieves the intended purpose of use, and overcomes the drawbacks of the related art.

While this disclosure has been described by means of specific embodiments, numerous modifications and variations could be made thereto by those skilled in the art without departing from the scope and spirit of this disclosure set forth in the claims.

What is claimed is:

1. An immersion liquid cooling heat sink, configured to be immersed in a dielectric liquid to cool a heat generating element, the immersion liquid cooling heat sink comprising:
   a substrate, configured to attach onto the heat generating element immersed in the dielectric liquid;
   a fin assembly, installed on the substrate, and comprising a first fin module and a second fin module, the first fin module and the second fin module respectively comprising a plurality of passages, wherein two ends of each passage are provided with an inlet and an outlet, the first fin module and the second fin module are spaced from each other and arranged side by side to define a first groove therebetween, and the first groove communicates between each inlet of the first fin module and each inlet of the second fin module; and
   a housing, installed on the substrate, comprising a first liquid inlet port, and entirely covering the fin assembly and exposing each outlet of the first fin module and each outlet of the second fin module, wherein the first liquid inlet port is located corresponding to and communicates with the first groove.

2. The immersion liquid cooling heat sink according to claim 1, wherein the fin assembly further comprises a connection part disposed corresponding to the first groove and communicating between a bottom of each inlet of the first fin module and a bottom of each inlet of the second fin module.

3. The immersion liquid cooling heat sink according to claim 1, further comprising a shunt member disposed in the first groove, the shunt member comprising a plurality of flow channels, the first liquid inlet port communicating to each inlet of the first fin module and each inlet of the second fin module through the flow channels.

4. The immersion liquid cooling heat sink according to claim 3, wherein the shunt member comprises a plate disposed between the first fin module and the second fin module, the plate comprises the flow channels, each flow channel is defined as a through hole penetrating through the plate, and the flow channels communicate between the first liquid inlet port and the first groove.

5. The immersion liquid cooling heat sink according to claim 4, wherein the shunt member further comprises two bent plates, the plate comprises two sides opposite to each other, the two bent plates are coupled to the two sides and bent relative to the two sides respectively, the two bent plates are installed at a top of each inlet of the first fin module and a top of each inlet of the second fin module respectively, and the plate is suspended in the first groove.

6. The immersion liquid cooling heat sink according to claim 3, wherein the shunt member comprises a plurality of protruding blocks spaced apart from each other and disposed protrusively on the substrate, the protruding blocks are located in the first groove, and each flow channel is defined between each two protruding blocks.

7. The immersion liquid cooling heat sink according to claim 6, wherein the fin assembly and the protruding blocks are integrally formed with the substrate.

8. The immersion liquid cooling heat sink according to claim 1, wherein the fin assembly further comprises a third fin module with the passages, the third fin module and the second fin module are spaced from each other and arranged side by side to define a second groove, the first groove communicates between each passage of the first fin module and each passage of the second fin module, the second groove communicates between each passage of the third fin module and each passage of the second fin module, the housing further comprises a second liquid inlet port located corresponding to the second groove and communicating to the second groove.

9. The immersion liquid cooling heat sink according to claim 8, wherein the housing comprises a first connector and a second connector coupled to the first liquid inlet port and the second liquid inlet port respectively, a connecting pipe coupled between the first connector and the second connector, and a docking port disposed between the first connector and the second connector.

10. The immersion liquid cooling heat sink according to claim 8, wherein the fin assembly further comprises a first connection part and a second connection part, the first connection part is coupled to the first groove and communicates between a bottom of an end of each passage of the first fin module and a bottom of an end of each passage of the second fin module, and the second connection part is coupled to the second groove and communicates between a bottom of an end of each passage of the third fin module and a bottom of another end of each passage of the second fin module.

11. The immersion liquid cooling heat sink according to claim 1, wherein the fin assembly is integrally formed with the substrate.

12. The immersion liquid cooling heat sink according to claim 1, wherein the substrate comprises a frame and a main body, the main body is installed in the frame, the first fin module and the second fin module comprise a plurality of fins spaced apart from each other and arranged side by side, and the fins are integrally formed with the main body.

13. The immersion liquid cooling heat sink according to claim 1, wherein the housing comprises a cover plate, the first fin module and the second fin module comprise a plurality of fins spaced apart from each other and arranged side by side, each fin comprising a first fin side and a second fin side spaced from each other, each first fin side of the first fin module and each first fin side of the second fin module are disposed on the substrate, the cover plate covers each second fin side of the first fin module and each second fin side of the second fin module, the cover plate comprises a biased portion, and the first liquid inlet port is defined on the biased portion.

14. The immersion liquid cooling heat sink according to claim 1, wherein the housing comprises a cover plate and two side panels, the two side panels are symmetrically coupled to two sides of the cover plate and bent relative to the cover plate, and the first liquid inlet port is defined on one of the side panels and located corresponding to the first groove.

15. The immersion liquid cooling heat sink according to claim 1, wherein the housing includes a cover plate to directly contact on a top surface of the fin assembly.

* * * * *